United States Patent
Thomas

(10) Patent No.: US 7,376,014 B2
(45) Date of Patent: May 20, 2008

(54) HIGHLY RELIABLE NAND FLASH MEMORY USING FIVE SIDE ENCLOSED FLOATING GATE STORAGE ELEMENTS

(76) Inventor: Mammen Thomas, 103 Schooner Cove, Hercules, CA (US) 94547

( * ) Notice: Subject to any disclaimer, the term of this patent is extended or adjusted under 35 U.S.C. 154(b) by 0 days.

(21) Appl. No.: 11/506,026

(22) Filed: Aug. 18, 2006

(65) Prior Publication Data
US 2008/0042184 A1    Feb. 21, 2008

(51) Int. Cl.
*G11C 11/34* (2006.01)
(52) U.S. Cl. .............................. 365/185.17; 365/185.26
(58) Field of Classification Search ........... 365/185.17, 365/185.26
See application file for complete search history.

(56) References Cited

U.S. PATENT DOCUMENTS

| | | | | |
|---|---|---|---|---|
| 7,227,786 B1* | 6/2007 | Thomas | .................. | 365/185.28 |
| 2005/0265076 A1* | 12/2005 | Forbes | .................. | 365/185.17 |
| 2005/0276105 A1* | 12/2005 | Yeh et al. | .............. | 365/185.17 |
| 2006/0262602 A1* | 11/2006 | Nazarian | ................ | 365/185.17 |
| 2006/0279991 A1* | 12/2006 | Park et al. | ............. | 365/185.17 |
| 2007/0121380 A1* | 5/2007 | Thomas | .................. | 365/185.17 |
| 2007/0133289 A1* | 6/2007 | Ma et al. | ............... | 365/185.17 |
| 2007/0153579 A1* | 7/2007 | Roohparvar et al. | ... | 365/185.17 |

* cited by examiner

*Primary Examiner*—Michael T Tran

(57) ABSTRACT

A NAND flash memory system with an array of individual charge storage elements, such as floating gates, arranged in a NAND string, each element being capable of selectively storing data in the form of charge there-in during a program or an erase operation, and during a read operation sensing the quantum of charge stored to provide reconstruction of data. Such a memory made with a floating gate that is spaced away from the diffusions and covered on all five sides except the channel side, by the control gate, there by having increased coupling with the associated advantage of lower high voltages, reduced impact of the unwanted disturb conditions, and providing for improved retention and reliability characteristics at higher operating temperatures is disclosed. The main emphasis in this technology is to provide a device with improved retention, endurance, and temperature characteristics meeting the Automotive specifications even with some area penalty.

20 Claims, 3 Drawing Sheets

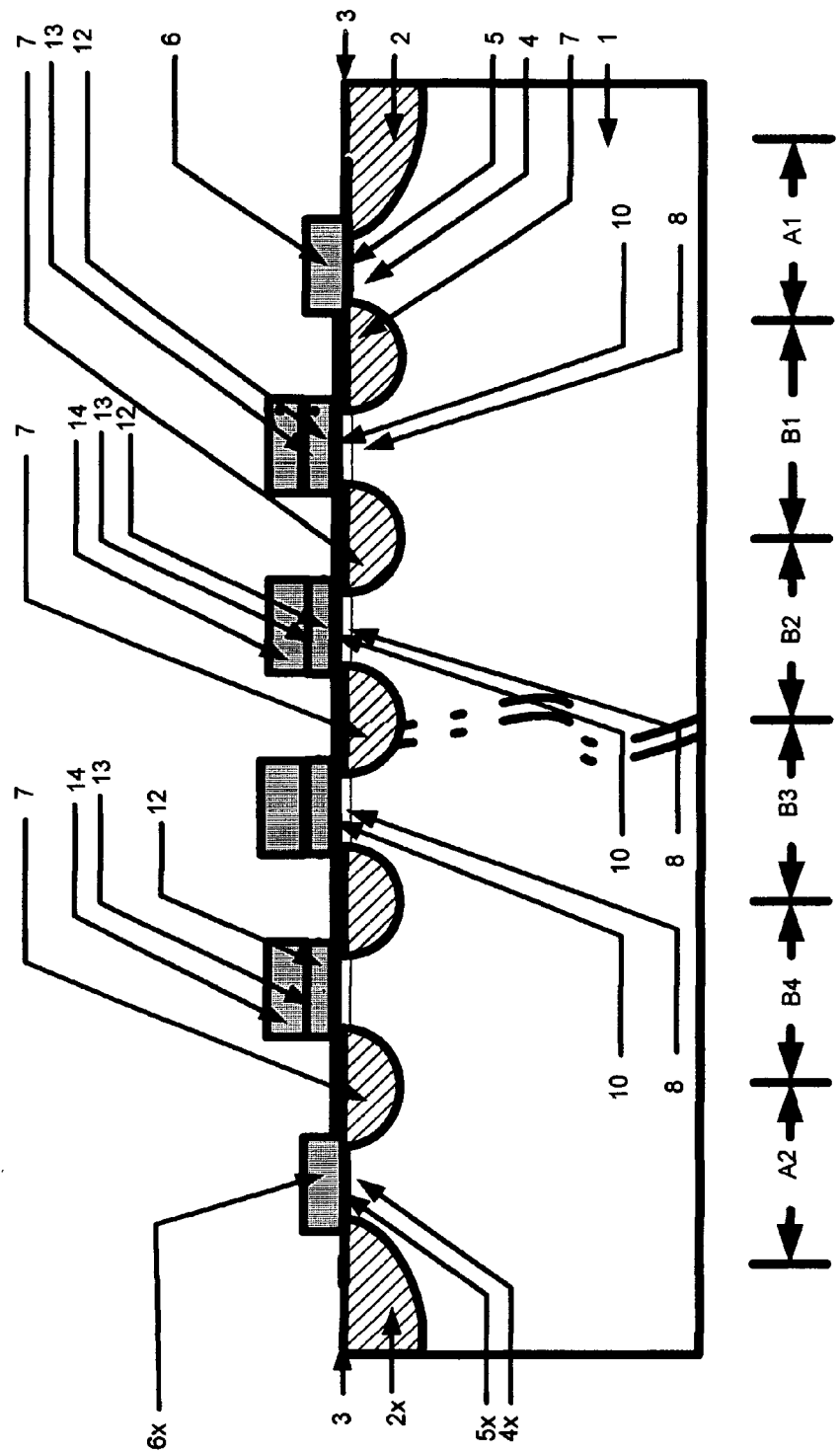

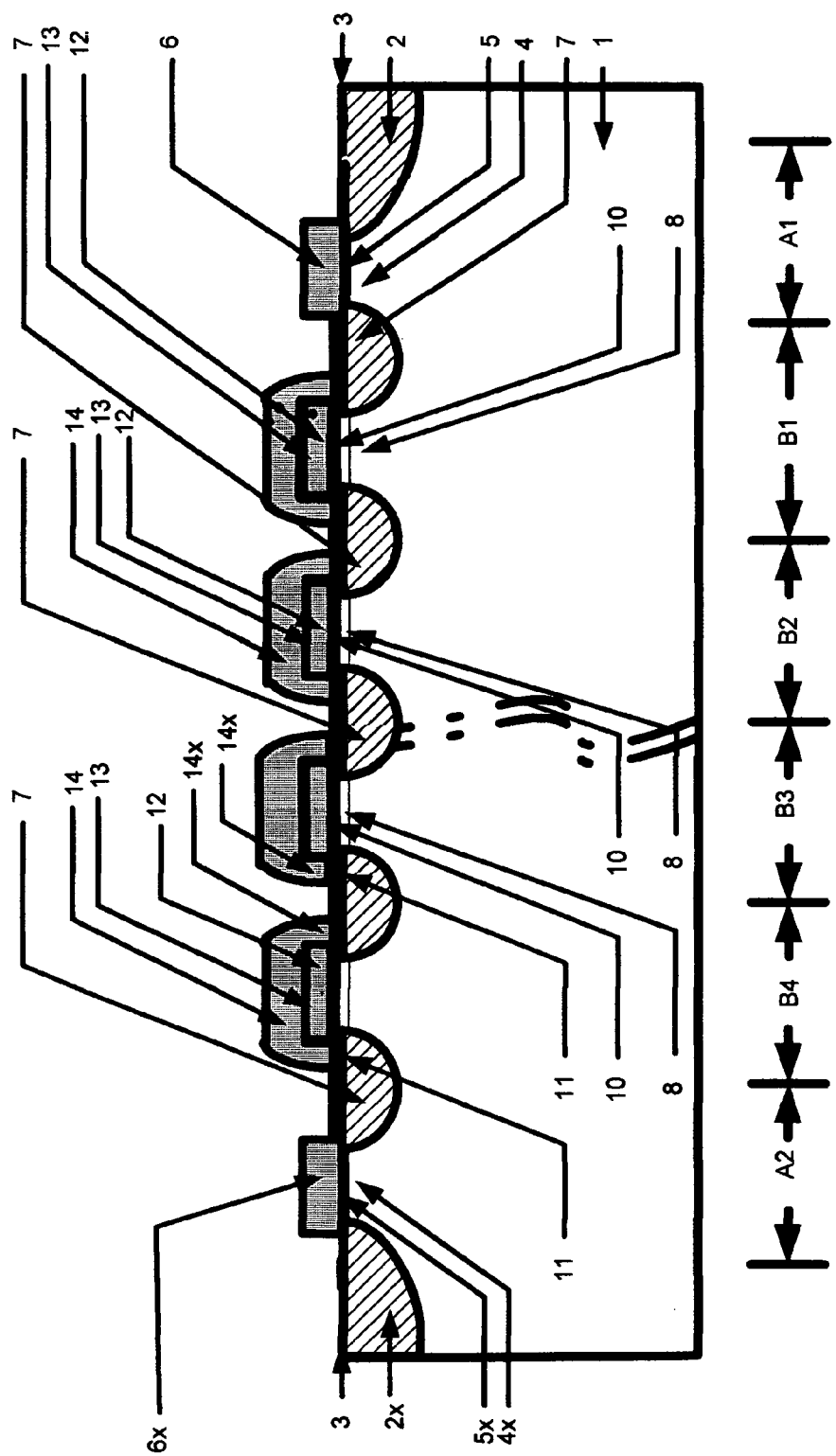

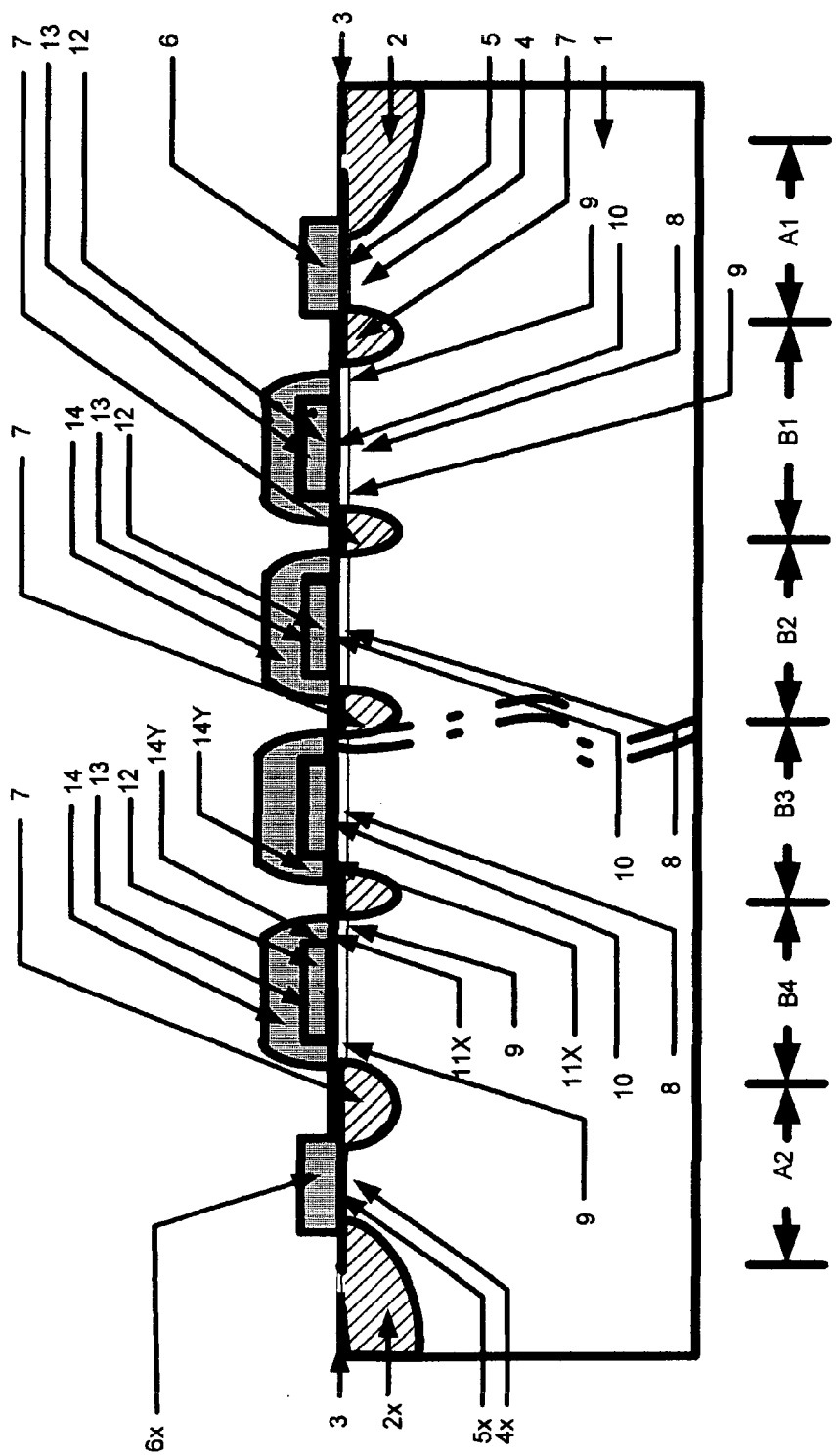

US 7,376,014 B2

HIGHLY RELIABLE NAND FLASH MEMORY USING FIVE SIDE ENCLOSED FLOATING GATE STORAGE ELEMENTS

FIELD OF THE INVENTION

This invention relates to high-density Non-Volatile Semiconductor memories of the Electrically erasable and programmable Read Only memory type particularly to high reliability NAND and related memory cells and arrays having wide temperature range of operation.

BACKGROUND OF INVENTION

A number of Flash Memory products exist today. They can be divided into two categories, the high-density components, mainly used for mass storage, and the high speed products, used for operational data storage. The Non-volatile field can be hence sub-divided in terms of the technology as the NOR implementation which is mainly good for very fast random access with execute in place capability, and the NAND implementation which is typically accessed in a serial mode, for program and read of large chunks of data at a time, that is suitable for high-density storage. Today the NOR and NAND memories share the market, with the NOR being larger in volume. The NAND memories are denser and the market for it has been growing at a faster pace than any other types of memories. Related Memories include architectural variations on the NAND memory interconnections for program and access using existing cell structures. This disclosure is a storage element and cell structure that can be used under different architectures by the people conversant with NAND and NOR memories, but it will be described using the well known and standard NAND structure for simplicity and understanding.

The NAND implementation is characterized by its capability to store and move large chunks of data, which can be accessed using a serial interface. In a typical NAND cell, area per storage bit is smaller than that for the NOR cell, as the NAND consists of multiple storage elements connected in series in the form of a NAND string which is in series with a drain select gate and a source select gate between two contacts. Typical number of storage elements in the NAND string has increased to 32 or more elements per cell. These elements in a cell are isolated from the rest of the cells that are connected to a bit line and the common source connection by The two select devices one at the drain end (drain select), between the drain contact and its nearest (the first) storage element, and another at the source end (source select) between the source contact and its nearest (the last) storage element in the string The interlink between the select devices and the storage elements and between the storage elements in a string is by a connective diffusion (the connect diffusion).

The program and erase functions of a typical NAND structure is by FN Tunneling between the floating gate and the memory well using voltages of 18 to 22V. This requires that devices that can withstand High voltage be used, in the peripheral circutry. The use of these high voltage devices, impact the speeds and make the devices slow. They also are large devices to prevent punch through with larger spacing between devices to avoid breakdown and leakage, thereby making the chip larger and more costly to manufacture.

Prior Art

FIG. 1 shows a typical prior art NAND memory structure. B1 to B4 are memory elements connected in series in a NAND string. A1 is a drain select device and A2 is a source select device. The drain diffusion (2) with the drain contact is separated from the nearest (first) memory element B1 by the Drain select device A1. Similarly the source diffusion (2x) and source connection are separated from the nearest (last) memory element B4, by the Source select device A2. The connect diffusions (7) link the memory element to the Source select and Drain select devices and to each other to provide an integrated series conductive path from source to drain in the cell when the select devices and the memory elements are in the "on" condition. The typical NAND cell in FIG. 1 is formed in a P-well (1) and comprise of N-channel elements and devices. The memory element of the prior art NAND cell is typically a channel region (8) controlled by the storage element (Bn), where 'n' is the number of the storage element (1 to 4) in FIG. 1. The storage element comprise, a stack etched floating gate poly silicon (12) separated from the channel (8) by a thin tunnel oxide (10), a control gate (14) that also acts as a word line over laying the floating gate and coupling to it through an inter-poly dielectric or protection oxide (13), as is well known and used in the Non-volatile memory cells. The NAND string or series connected storage elements B1 to B4 in FIG. 1 are isolated from the word line drain contact diffusion (2) and source line diffusion (2x) by the drain select device A1, and the source select device A2. A1 isolates the first connect diffusion (7) from the drain (2) by having a select channel (4) controlled by poly-silicon select gate (6) over laying a gate oxide (5). Similarly A2 isolates the last connect diffusion (7) from the source (2x) by having a select channel (4x) controlled by poly-silicon select gate (6x) over laying a gate oxide (5x). An integrated and interconnected channel can be formed by the diffusions (7) the channel regions (8) under the storage elements (B1 to B4), the channel regions under the select devices (4 and 4x) connecting the drain diffusion (2) to source diffusion (2x) in each storage cell.

In a memory, the cells are arranged in columns, each column having a bit line that connects all the drains of the cells in a column together. The source is common and connected together typically by a diffusion running in a direction perpendicular to the bit line and parallel to the word direction. The columns are then arranged together to form an array as will be well known to those who are involved in the art of memory. Every row of elements in an array is interconnected, in a direction perpendicular to the bit line direction, that is, the in a row direction, by the control gate that form the word line. The drain select lines and the source select lines are also interconnected in the row direction in the array providing selection capability to a row of cells in the array. The formation of the array and its various interconnection methods are well known to practitioners in the industry. NAND arrays are erased as a block of cells, that is, a number of pages of elements in one or more rows of cells. In a typical NAND array each column of cells has one or more data registers attached to the bit line. The data is loaded in serial fashion into, and also read from, these data registers. The data is then transferred in parallel to the set of elements selected (a typical page of data at a time) during program. Similarly data from a set of elements selected for read are transferred in parallel into the registers for serial read out during read operation.

A typical memory array (referred at times as bulk) comprise of all blocks of memory where a typical block comprise a group of cells with elements distributed and connected along the rows by the word lines. Typically each word line interconnects elements in a row to form a page of memory. Blocks can be one or more cells in depth along the column though a typical block is a cell in depth. The bulk is the entire memory array comprising of all the cell blocks. It should be noted that there are different ways of interconnecting the elements and cells in an array. Those who are conversant with memories and their architectures will know the different interconnection modes within the array.

The typical write operation of a prior art NAND cell, comprise both the erase operation where by the electron charge is removed, are by Fouler-Nordheim Tunneling (FN Tunneling) in a block or bulk mode, and the program operation, where by electrons are stored in the floating gate. The first operation is typically the erase operation when the electron charge in the floating gates of the storage elements are removed. This is done by generating a voltage gradient of sufficient magnitude across the tunnel oxides (10) of the storage elements to remove electrons from the floating gate (12), by high voltage gradient of the right polarity applied between the control gate (14), that will be coupled down to the floating gate from the control gate, and the well (1) to appear across the floating gate oxide. The necessary field across the tunnel oxide to achieve erase can be induced in three ways: 1) by applying a high negative voltage (−Vpp) to the control gate with the well at '0'V, 2) by applying a lower negative voltage (approx. −½ Vpp) to the control gate and applying a positive voltage (approx. ½ Vpp) to the well, or 3) by applying a high positive voltage (Vpp) to the well while keeping the control gates at '0' potential. Of these the most common is to apply high voltage to the well with control gate at '0' potential for erase. This mode of erase is non selective and the memory cells are erased as a block (group of cells in a row or multiple rows in a specific well) or bulk (all cells on chip), based on the applied voltage on the control gate and the well.

Typically program is the selective operation and it is done on a page (all storage elements along a row or word line) level. The data which may be '1' or '0' is loaded into a set of registers serially and then presented to the cells through the bit lines, the lines connecting the drains of all the devices in a column of the array. Typically a self boost scheme is employed to write a '1', that is leave the selected storage element, on the selected word line in the erased state while a '0' allows programming of the selected storage element.

Assume that the data register is loaded with a '0' indicating that the element in the cell needs to get programmed. The '0' loaded in the register keeps the bit line connected to it and hence the drain diffusions (2) in the column of cells connected to the bit line at ground '0' potential. The gate (6) of the Drain select transistor (A1) of the selected row of cells is pulled to value approx. equal to Vdd, during write, turning on the drain select device. The source select transistor (A2) is kept in the off condition by keeping the gate (6x) of that device at ground or '0' potential. The unselected word lines in the selected cell are kept at an intermediate high voltage close to half the programming voltage (Vpp/2). This turns on the channel (8) of unselected storage elements by the application of the voltage (½ Vpp) to the control gates (14) of the storage elements connected to the unselected word lines. The coupled down voltage to the floating gates (12) of the unselected storage elements, is not sufficient to cause tunneling across the tunnel oxide (10) between the floating gate and the channel (8), even though the channel is at ground potential. The selected word line is pulled up to the full programming voltage (Vpp). This provides the high voltage (Vpp) to the control gate (14) of the selected storage element. This voltage applied is sufficient, as the channel (8) of the selected element is at ground or '0' potential, to produce a coupled down voltage on the floating gate (12) of the selected storage element, if the channel is at ground potential, to provide sufficient potential gradient across the tunnel oxide (10) between the floating gate (12) and the channel (8) of the selected storage element, to cause tunneling of carriers across the tunnel oxide (10) and accumulation of charge in the floating gate from the channel. Since the select gate (6) for drain select transistor is approx. at Vdd and the bit line connected to the drain (2) is at ground, and all the series storage elements in that selected cell are fully on, the ground voltage from the bit line appears in the channel under the selected element, and hence cause programming of the element. This programming process does not generate a current flow in the cell, other than that required to charge the capacitors and program the storage element, in fact it is a very low power programming process.

Now if the register connected to the bit line is loaded with a '1', that is a value close to Vdd, when the word lines in the selected cell are pulled up, the unselected word lines to approx. Vpp/2 and selected word line to Vpp, similar to the case explained earlier, the floating gates in the cell has a coupled up voltage which in turn tries to pull up the channel voltage by capacitive coupling. If the channel voltage is not actively pulled to ground as in the earlier case, but is allowed to rise to a value close to Vdd value, the drain select device of the selected cell, by virtue of having its gate (6), its drain diffusion (2) and its source diffusion, which is the first connect diffusion (7) all at a voltage close to Vdd, is shut off and the channel remains free to float to a value of voltage dictated by the capacitive coupling limited by the leakages. This causes the integrated channel {all the connect diffusions (7) and the channels beneath the storage devices (8)} to be pulled up to a value high enough by the coupled voltage to prevent the potential gradient across the tunnel oxide (10) of the selected storage element from reaching a value sufficient to generate a potential gradient across the tunnel oxide for tunneling to take place. This in turn result in the selected storage element being left erased. Thus the data stored in the selected storage element is directly related to the information stored in the register connected to the related bit line. In a NAND cell this program operation is done for storage elements connected to a single word line in a row of selected cells at a time and is called page program.

Read back of the data is accomplished by checking the status of the storage element using a sense circuit and hence getting the data back and it is well known in the industry. Multiple sense schemes are available for sensing and retrieving the data stored in the storage elements of the cell. Typically the read back is also done for an entire page at a time and data stored in page register and is serially streamed out from these registers.

It has been shown that the thickness of the tunnel oxide is of the order of 70A and cannot be scaled without impacting the reliability and disturb characteristics of the elements. In order to cause tunneling typical potential gradient of 10 MeV/cm is necessary, that is a voltage of over 7 V applied across the tunnel oxide is essential to initiate tunneling with the 70A oxide. The prior art NAND cells use the stack etch technology to self align the control gate and the floating gate. This provides a three-sided coverage of the floating gate by the control gate. The coupling between the control gate and the floating gate of the storage element is typically of the order of 45-50%. This means that only about half the voltage applied to the control gate is coupled down to the floating gate to appear across the tunnel oxide. This in turn mandates relatively high voltage Vpp use during program and erase operations. In order to improve this coupling ONO, an Oxide-Nitride-Oxide sandwich inter-poly dielectric, with a Nitride inter-layer that has a higher dielectric constant than oxide, has been used in the prior art. This ONO process adds to the mask count and process complexity and hence the cost of the memory. In return it reduces the high voltage requirement of the cell marginally by increasing the coupling to around 60%. The ONO introduces problems of retention as the Nitride itself conducts charge through hopping conduction that is well known in the industry. The use of the two oxide layers on top and bottom of the Nitride of sufficient thickness is to prevent this leakage, which in turn increase the thickness of the inter-poly dielectric and hence reduce the coupling and the ability to scale. It should be noted that if the coupling ratio of the NAND Storage element, that is the ratio of the coupling between the control gate and floating gate as against the total coupling to the floating gate from all sides is low, only that amount of the applied voltage to the control gate appear on the floating gate. This also means that voltage gradient due to Vpp (1-the coupling ratio) appear across the inter-poly dielectric, causing stress to that dielectric increasing the leakage through the dielectric ONO layer.

The Nitride layers are also prone to accumulation of charge by trapping in the layer. At high voltages used in the program and erase process of the prior art cell, the Inter-layer dielectric is subject to high potential gradients. These are usually sufficient to cause charge transport through the layer and hence trapping. This trapped charge will cause accelerated window closing during write cycling and reduce the reliability of the cell in operation.

The leakage characteristics and the charge trapping characteristics of the ONO are made worse under high temperature and high voltage conditions and impact the high temperature characteristics of the storage element, typically making it less suitable for high temperature operation in industrial and automotive applications.

Another problem that has been identified in the prior art cells as the technology shrinks is the problem of coupling of the floating gate to adjacent memory elements through the open sides of the floating gates. This can result in voltage swings in the cell that are not designed in and controlled.

All these results in problems of cell disturb and problems of data retention in the memory cells.

Another problem is the encroachment of the connect diffusion under the tunnel oxide. This has the effect of reducing the reliability of the cell by making a high doped region with its field regions to be under the tunnel oxide and the floating gate thereby changing the uniformity of tunneling from the channel. This can reduce the program-erase or write cycling characteristics of the memory elements by localized degradation. This also has an impact on the high temperature characteristics of the cells and retention characteristics of the cell due to generation-recombination in the depletion region resulting in collection of charge by the floating gate.

Some of the problems of the typical present day NAND flash cell are:
1. Very high Voltage program and erase operation.
2. Low coupling resulting in increased stress on the inter-poly dielectric.
3. Lack of ability to scale vertically the inter-poly dielectric.
4. Lack of ability to scale without being affected by coupling to neighboring cells.
5. Need for sophisticated program erase controls to prevent over programming and over erase.
6. Full processor controlled reliability screening and redundancy due the cells being prone to disturb conditions.
7. Frequent checks and error correction methods are needed to ensure that the cells retain the data.
8. Reduced high temperature capability (typical commodity operation).
9. Reduced data retention.
10. Reduced program erase cycling.
11. Difficult to scale devices with technology node without impacting performance due to punch trough.
12. Process complexity increases with ONO.

What is Proposed

What is proposed is a cell and technology to be used in a NAND memory array. Three separate modifications/improvements are proposed, that improve the operation, the operating temperature range and increase the reliability, both retention and endurance, of the cell. The first modification (modification 1) is one that uses a five side overlapping control gate, to improve coupling ratio with associated reduction in the program and erase voltages, and elimination of unwanted disturb conditions due influence of the neighboring cell through coupling to the floating gate. The high coupling ratio reduces the stress on the inter-poly dielectric and hence improves retention and endurance characteristics. The second modification (modification 2) is by using the five side overlapping control gate structure to space away the diffusion edge from the floating gate and providing a pair of side select gates in parallel with the floating gate, on either side of the floating gate, to eliminate the variations in the field due to high doping in the channel and hence improve the uniformity of tunneling from the channel through the tunnel oxide. This improvement moves the high field depletion regions where electron hole pair generation takes place, especially with increased temperature, away from the floating gate, there by improving the operating temperature range of the devices. This improvement also improves the endurance and data retention characteristics of the cell by improving the uniformity of current flow through the tunnel oxide and hence reducing the damage to the oxide. The use of the five side coverage of the floating gate with the improvement in coupling ratio provide a third improvement, (modification 3) that is the ability to use high quality grown or deposited oxide or a combination of the two oxides as inter-poly dielectric instead of ONO. The increased coupling ratio also allows reduction in the inter-poly oxide thickness as the voltage appearing across it is reduced. FIG. 2 is a first implementation of some of the proposed embodiment with the modification 1 that provides the five side coverage of the floating gate by the control gate, and FIG. 3 is the preferred implementation with modifications 1 and 2. Modification 3 can be implemented in both implementations shown in FIG. 2 and FIG. 3, as both have high coupling ratios due to the coverage and low inter-poly voltage drop. Use of Oxide as the inter-poly dielectric brings with it some additional advantages. First is the simplification of the manufacturing process due to the elimination of steps needed for ONO processing. Second is the improvement of retention characteristics of the cells due to elimination of charge leakage by hopping conduction through the Nitride. Third is the improvement in write cycling reliability, by the reduction of window closing effect due to charge trapping in the Nitride of the ONO.

The cell architected is not for high-density and is not the smallest NAND cell, instead it has been architected for improved manufacturability, quality and reliability. The disturb conditions have been eliminated by cell and array design and retention and endurance (write cycling) characteristics are improved. This cell will also be much more manufaturable and yieldable as ONO issues are eliminated and lower voltages are used to program and erase. The use of the side select gates of the embodiment in FIG. 3 enable the cells to be in depletion or enhancement during operation.

Some of the advantages of the proposed cell are:
1. A lower program erase voltage is used as compared to the existing NAND structures at the same node due to the improved coupling ratio from 50 to 80%.
2. Eliminates the need for ONO and allows the use of Oxide as inter-poly dielectric, making the element easier to manufacture and more robust.
3. The cell with side select gates is immune to over erase problems.
4. Eliminates the unwanted coupling from adjacent cells to the floating gate.
5. The lower Program-erase voltage reduces the stress on the inter poly oxides and hence increases the reliability of the cell.
6. Provides cells that are capable of high temperature operation by moving the junction depletions, where thermal generation and acceleration take place, away from under the floating gate.
7. Very high retention is achieved due to low and uniform tunnel currents by elimination of junction depletion overlap of floating gate.

DESCRIPTION OF DRAWINGS

FIG. 1: Prior Art NAND cell—with Stack etched storage element.

FIG. 2: Proposed MEMTEK NAND cell-1 with Five side covered storage element.

FIG. 3: Proposed MEMTEK NAND cell-2 with Five side covered storage element and spaced off connect diffusions.

EXPLANATION OF NUMBERING AND LETTERING IN THE FIGS. 1, 2 AND 3

A1. Drain Select device.
A2. Source select device.
B1 to B4. Storage elements of the NAND cell (a 4 element NAND shown)
1. Well in substrate.
2. Drain diffusion.
2$x$. Source diffusion.
3. Drain contact (contact to bit line)
3$x$. Source Contact.
4. Drain select device channel.
4$x$. Source select device channel.
5. Gate oxide of drain select device.
5$x$. Gate oxide of source select device.
6. Gate poly of drain select device.
6$x$. Gate poly of source select device.
7. Interconnect diffusion or connect diffusion.
8. Channel of storage element.
9. Side select gate channels formed on either side of floating gate controlled by the overlapping control gate covering the sides of floating gate over the channel.
10. Tunnel Oxide.
11. Oxide under the control gate overlap along channel region over difusion
11$x$. Oxide under the control side select gate along channel region
12. Floating gate of storage element or floating gate
13. Inter-poly dielectric.
14. Control Gate poly-silicon or control gate electrode

14$x$. Control gate poly-silicon region overlapping and covering the sides along the channel direction of floating gate over connect diffusion.
14$y$. Control gate poly-silicon region overlapping and covering the sides along the channel direction of floating gate forming the side select gates.

DESCRIPTION OF THE INVENTION

Embodiment Shown in FIG. 2: FIG. 2 shows one embodiment of the invention in a typical NAND cell. Like the prior art cell this NAND cell structure comprise multiple storage elements, (four used for the example) B1 to B4, arranged in series with a drain select device A1 separating the drain diffusion (2) from the first storage element B1, and a source select device A2 separating the source diffusion (2$x$) from the last storage element B4. Typically there can be 8,16,32 or 6e elements in a NAND string. The elements are connected in series with the drain and the source select devices by connect diffusions (7). The connect diffusions (7) act as the source diffusion for the drain select device, drain diffusion for the source select device, and drain and source diffusions for the storage elements as will be well known to individuals who understand devices.

Each storage element is deposed between two connect diffusions (7) that connect it to the neighboring element or if it is the last or first element, to the select device. The figure shows a four storage element cell implementation for simplicity. The number of elements in a NAND string can be any where up to 64 in a typical cell. This number being limited by the cell current requirement for read operation. The storage element itself comprise a floating gate (12) over laying a tunnel oxide (10) on silicon surface, that floating gate having control of the conductance of a channel (8) in silicon, in an implanted well (1). [The well typically being a P-well inside an N-well in a typical n-channel implementation and the well typically being an N-well in a P substrate in the case of a P channel implementation. For simplicity of explanation the N-channel implementation is described here after.] A control gate (14) separated from the floating gate (12) by an inter-poly dielectric (13) over lays the floating gate and couples to it by means of capacitive coupling. In this embodiment of the disclosure, the floating gate overlaps the floating gate on all five sides, except the tunnel oxide side, unlike the prior art where only three sides of the floating gate are covered by the control gate, the sides along the diffusion being left uncovered and protected by a dielectric layer only. The overlapping region of the control gate (14$x$) along the channel region, in the embodiment in FIG. 2 over lays the connect diffusion and is separated from the connect diffusion by a thick oxide (11).

Operation of Embodiment of FIG. 2: The over all operation of the cell and array in this embodiment shown by FIG. 2 is similar to the prior art cell described earlier. The higher coupling ratio in the storage elements, B1 to B4, provide associated advantages, mainly related to lower applied potentials, and lower stress on the inter-poly dielectric (13). The covered floating gate (12) is also protected from influence of neighboring cell coupling by the overlapping control gate covering it. One of the major advantages of the architecture of the cell is that the coupling of the control gate side walls (14$x$) to the channel and diffusions is higher due to the poly side gate (14$x$) coupling through the oxide (11) to the connect diffusion (7). This will enable a lower voltage on the control gate (14) to provide the necessary program inhibit voltages for the selected cell during write. The cell is erased typically by application of a high voltage to the well (1) and ground potential to the control gate (14). The coupled down voltage gradient across the tunnel oxide (10) if sufficient to cause tunneling of negative carriers from the floating gate to the well, will erase the element. Since the well is common to a set of cells, it is possible to erase all elements in a row of cells or multiple rows of cells, in an array within the well, in one erase operation providing the necessary flash erase operation. During erase the source select device and the drain select device are kept in the off state by application of ground potential to the gates of these devices.

Programming of an element, of the cell is the selective operation. If the selected element B2 of the selected cell is to be programmed, per the data, a "0", a ground potential is impressed on the drain diffusion (2) of the selected cell with the drain select transistor channel (4) turned on by application of a suitable positive voltage to the gate (6) and the channel (4x) of the source select transistor of the cell in the off condition by application of ground potential to the gate (6x) of that device. The channels of all the unselected elements B1, B3 and B4 of the cell will typically have a voltage approximately equal to Vpp/2 applied to the control gates (14). This voltage when coupled down to the floating gates (12) is sufficient to fully turn on the channels (8) of these elements, but not sufficient to initiate tunneling across the tunnel oxide (10) in these elements. The selected element B2 to be programmed will have Vpp applied to the control gate (14). This will couple down to the floating gate (12) of the element and turn on the channel (8) under the element. At this point the turned on channels (4) causes the voltage applied to drain diffusion (2) to be passed along the on channels, such that all the connected channels are at the ground potential. The on state of the drain select device channel (4) with drain diffusion (2) grounded will pull the connected channels down to ground and will not allow the channels to float up to higher voltages through coupling from the control gates and floating gates of the devices to the channel. In the selected element alone the high coupled down voltage on the floating gate (12) of the selected element from Vpp applied to the control gate (14) of that element is sufficient to provide a potential gradient across the tunnel oxide (10) from the channel (8) to the floating gate (12) that can sustain tunneling of carriers from the channel (8) to the floating gate (12) of the element and hence program the cell.

In the alternate case when a selected element of a selected cell in FIG. 2. is to be left un-programmed during the programming operation, based on the data, then a "1" or a voltage typically close to Vdd is applied to the drain diffusion (2) of the selected cell.

The condition for programming the selected element is set up as explained for the case where the drain is connected to "0" potential. Since the drain is at a potential close to Vdd and the gate (6) of the drain select device A1 is at a potential close to Vdd the channels of the elements B1 to B4 tends to the same potential when the voltages of Vpp/2 are applied to the control gates (14) of the unselected elements and Vpp is applied to the control gate (14) of the selected element, to turn on the channel. Once the channel reaches a potential close to Vdd the channel (4) of the drain select device is shut off as the gate (6) is no longer at a Vt higher than the diffusions. This allows the coupled down voltages from the control gates to the channel and the connect diffusion across the oxides to pull up or boost the connected channels to a high voltage. This higher voltage is of a sufficient value such that the potential across the tunnel oxide (10) from the channel (8) becomes insufficient to initiate tunneling across the tunnel oxide (10) even with Vpp applied to the control gate (14) of the selected element B2. Thus the selected element is left in the state it was previously, or program operation is inhibited.

Read back of the data is accomplished by checking the status of the storage element using a sense circuit and hence getting the data back as is well known in the industry. Multiple sense schemes are available for sensing and retrieving the data stored in the storage elements of the cell. Assume B2 is to read back. Typically this is done by turning on the channels (8) of all the unselected elements B1, B3 and B4 in the cell by applying suitable voltages to the control gates (14) of these elements, with both source select and drain select channels (4 and 4x) turned on by application of suitable positive voltages to the gates (6 and 6x). A read voltage is impressed across the channels from drain diffusion (2) to source diffusion (2x). The current flowing through the cell is sensed with the selected control gate (14) at ground potential. If the floating gate (12) of B2 is in the programmed state, that is charged negative, there will be no current flow in the cell as the cell threshold is higher than Vdd/2. If the floating gate of the element is charged positive, the channel (8) under the element will be in the on state as the other channels and there will be a current flow. The selected element may also be sensed with a voltage of the order of Vdd/2 (close to the neutral Vt of the element) on the control gate to increase the cell current and improve the read current and hence the speed. Different sense conditions other than the two described can be used to sense the state of the element as is well known in the industry.

This embodiment allows increased coupling between the floating-gate (12) and control gate (14) by having the control gate region (14x) cover the floating gate on the sides along the diffusions (7) over the protective oxide (11), covering the inter-poly protective dielectric (13) on the side walls of the floating gate. In the prior art these sides are stack etched and are only covered by a protective dielectric layer. The additional covered region increase the area of coupling between the floating gate and the control gate through the inter-poly dielectric layer (13). This coverage provide the following advantages to the cell storage element described and shown in FIG. 2:

1. There is increased coupling due to the side-wall area coupling between the floating gate and control gate poly-silicon.
2. There is increased coupling between the channel connect diffusion and the control gate due to the overlap of the control poly over the diffusion region.
3. Lower high voltages can be used for program and erase due to high coupling ratio.
4. Lower high voltages used will provide the inhibit voltage necessary through boosting due to the coupling between the control gate overlap with the connect diffusion.
5. The control gate poly-silicon covered floating gate has more protection from damage and from external contaminants.
6. Reduced potential difference between the floating gate and control gate allow reduction in thickness of inter-poly dielectric. (Improving the coupling further)
7. Reduced voltage stress across the inter-poly dielectric, reduces the damage to the dielectric and hence reduces the leakage of charge across the dielectric.
8. Five-side coverage of the floating gate eliminates the coupling effects on the floating gate from the neighboring elements and metal making the cell more robust.
9. Lower high voltage requirements enable high-speed designs.

10. Lower high voltage requirements enable smaller peripheral high voltage device and reduce overall chip area.
11. Lower high voltages reduce process complexity and constraints.
12. High coupling in the storage element and the low voltage stress across the inter-poly dielectric enable the use of oxide instead of the ONO dielectric. This oxide can be grown, deposited or a combination of the two.
13. The use of oxide as the dielectric eliminates the known leakage by hoping conduction through Nitride.
14. The use of oxide also eliminated the charge trapping in the Nitride layer with the associated enhanced window closing during write cycling.
15. The elimination of ONO makes the processing simpler.

Embodiment Shown in FIG. 3 (Preferred Embodiment with the Advantages of the Embodiment in FIG. 2 Plus Improved High Temperature Operation and Higher Reliability): FIG. 3 shows an embodiment of the invention that is different from the flash cell shown in FIG. 2 in that each of the storage elements (B1 to B4) comprise of three integrated device regions or controllable channel regions, one channel region controlled by the floating gate and two side select channel regions on either side of the floating gate, both controlled by the same control gate, as explained herein. Each storage element comprise a floating gate (12) deposed on a tunnel oxide (10) on the silicon surface of the well (1), an inter-poly dielectric (13) that cover the floating gate on all five sides, excluding the side of the tunnel oxide (10), a control gate poly-silicon (14) deposed on the top and (14Y) on the sides of the floating gate(12), a thick oxide (11x) separates the silicon surface of the well (1) from the control gate region (14Y) which form the poly-silicon side cover for the floating gate and also form two side select gate channels (9) on either side of the floating gate that is controlled by the voltage applied to the channel through the control gate over lap at locations (14Y). The connect diffusions (7) are spaced away from the edge of the floating gate (12) by the control gate poly silicon sidewall.

The control of the channel regions of each element can be further elaborated as follows. One channel region, under the tunnel oxide (10) controlled by the voltage impressed or stored on the floating gate (12) and two channel regions (9), under the thick gate oxide (11x), on either side of the channel (8) controlled by the voltage impressed by the control gate through the side select regions of the control gate (14Y)

The connect regions (7) in this embodiment is spaced away from the edge of the tunnel oxide and hence the floating gate. This has the advantage of moving diffusion (7) away from the floating gate and hence eliminating the variations in field due to the diffusions from impacting the tunnel current during write or read operations. This spacing off of the diffusion from the edge of the tunnel oxide area makes the write field more uniform in the tunnel oxide and the cell more robust. It makes the cell capable of higher temperature operation due to spacing the generation recombination region of the doped regions (the depletion regions due to the doping) away from the floating gate. It also makes the cell more reliable with respect to data retention and endurance by improving the uniformity of tunneling of the whole tunnel oxide under the floating gate.

The memory cell comprise of multiple storage elements connected in series with connect diffusions (7) and source and drain select devices between a drain and a source diffusion as described previously and shown in FIG, 2 and FIG. 3 of the embodiments.

Operation of Embodiment of FIG. 3: The operation of the cell in FIG. 3, which is the preferred embodiment, is similar to that of the implementation in FIG. 2 and the prior art cells, though some differences exist due to the two parallel side select devices (9) that exist on either side the floating gate device, in each storage element (B1 to B4). As with the embodiment described earlier and shown in FIG. 2, the first operation is the erase operation.

Here again the higher coupling ratio in the storage elements, B1 to B4, provide associated advantages, mainly related to lower applied potentials, and lower stress on the inter-poly dielectric (13). The covered floating gate (12) is also protected from influence of neighboring cell coupling by the overlapping control gate covering it. One of the major advantages of the architecture of the cell is that the coupling of the control gate side walls (14Y) to the channel is higher due to the poly side gate (14Y) coupling through the oxide (11x) to the channel region underneath (9). This will enable a lower voltage on the control gate (14) to provide the necessary program inhibit voltages for the selected cell during write. The cell is erased typically by application of a high voltage to the well (1) and ground potential to the control gate (14). The coupled down voltage gradient across the tunnel oxide (10) if sufficient to cause tunneling of negative carriers from the floating gate to the well, will erase the element. Since the well is common to a set of cells, it is possible to erase all elements in a row of cells or multiple rows of cells, in an array within the well, in one erase operation providing the necessary flash erase operation. During erase the source select device and the drain select device are kept in the off state by application of ground potential to the gates of these devices.

Programming of an element, of the cell is the selective operation. If the selected element B2 of the selected cell is to be programmed, per the data, a "0", a ground potential is impressed on the drain diffusion (2) of the selected cell with the drain select transistor channel (4) turned on by application of a suitable positive voltage to the gate (6) and the channel (4x) of the source select transistor of the cell in the off condition by application of ground potential to the gate (6x) of that device. The channels of all the unselected elements B1, B3 and B4 of the cell, will typically have a voltage approximately equal to Vpp/2 applied to the control gates (14). This voltage when coupled down to the floating gates (12) is sufficient to fully turn on the channels (8) and also turn on the side select channels (9) through the control gate over lap region (14Y) of these elements, but not sufficient to initiate tunneling across the tunnel oxide (10) in these elements. The selected element B2 to be programmed will have Vpp applied to the control gate (14) and side select regions (14Y). This will couple down to the floating gate (12) of the element and turn on the channel (8) under the element. It will also turn on the side select channels (9) under the thicker oxide (11x) by the control gate overlap region (14Y). At this point the turned on channel (4) of the drain select gate causes the voltage applied to drain diffusion (2) to be passed along the on channels (8 and 9) of the elements, such that all the connected channels are at the ground potential. The on state of the drain select device channel (4) with drain diffusion (2) grounded will pull the connected channels down to ground and will not allow the channels to float up to higher voltages through coupling from the control gates and floating gates of the devices to the channel. In the selected element alone the high coupled down voltage on the floating gate (12) of the selected element from Vpp applied to the control gate (14) of that element is sufficient to provide a potential gradient across the tunnel oxide (10) from the channel (8) to the floating gate

(12) that can sustain tunneling of carriers from the channel (8) to the floating gate (12) of the element and hence program the cell.

In the case where a selected element of a selected cell in FIG. 2. is to be left un-programmed during the programming operation, based on the data, then a "1" or a voltage typically close to Vdd is applied to the drain diffusion (2) of the selected cell. The condition for programming the selected element is set up as explained for the case where the drain is connected to "0" potential. Since the drain is at a potential close to Vdd and the gate (6) of the drain select device A1 is at a potential close to Vdd the on channels (8 and 9) of the elements B1 to B4 tends to be raised to the same potential when the voltages of Vpp/2 are applied to the control gates (14) with the same voltage appearing across the thick side select oxide (11x). A higher programming voltage of Vpp is applied to the control gate (14) of the selected element, to turn on the channels (8 and 9) of the selected element. Once the connected channel under B1 to B4 reaches a potential close to Vdd the channel (4) of the drain select device is shut off as the gate (6) is no longer at a Vt higher than the diffusions on either side of the gate. This allows the coupled down voltages from the control gates to the channel and the connect diffusion across the oxides to pull up or boost the connected channels to a higher voltage. This higher voltage is of a sufficient value such that the potential across the tunnel oxide (10) from the channel (8) becomes insufficient to initiate tunneling across the tunnel oxide (10) even with Vpp applied to the control gate (14) of the selected element B2. Thus the selected element is left in the state it was previously, or program operation is inhibited.

Read back of the data is accomplished by checking the status of the storage element using a sense circuit and hence getting the data back as is well known in the industry. Multiple sense schemes are available for sensing and retrieving the data stored in the storage elements of the cell. Assume B2 is to read back. Typically this is done by turning on the channels (8) and side select channels (9) of all the unselected elements B1, B3 and B4 in the cell by applying suitable voltages to the control gates (14), which in turn gets applied also to the side select regions of the control gate (14Y) of these elements, with both source select and drain select channels (4 and 4x) turned on by application of suitable positive voltages to the gates (6 and 6x). A read voltage is impressed across the channels from drain diffusion (2) to source diffusion (2x). The current flowing through the cell is sensed with the selected control gate (14) at a potential sufficient to turn on the side select channels fully but not enough to turn on an off channel of the floating device. If the floating gate (12) of B2 is in the programmed state, that is charged negative, there will hence be no current flow, or low current flow in the cell as the cell threshold is higher than the applied voltage to the select device, typically, Vdd/2. If the floating gate of the element is charged positive, the channel (8) under the element will be in the on state as the other channels and there will be a current flow. The selected element current in this case will be limited by the side select device drive and higher voltages that can be applied to the control gate will provide higher read current as long as the impedance of the unselected elements can be made lower than that of the selected element . Different sense conditions other than the one described can be used to sense the state of the element as is well known in the industry.

This embodiment allows increased coupling between the floating gate (12) and control gate (14) by having the control gate region (14Y) cover the floating gate on the sides along the side select channel regions (9) over the protective oxide (11x), covering the inter-poly protective dielectric (13) on the side walls of the floating gate. In the prior art these sides are stack etched and are only covered by a protective dielectric layer. The additional covered region increase the area of coupling between the floating gate and the control gate through the inter-poly dielectric layer (13). This coverage provides the following advantages to the cell storage element described and shown in FIG. 3:

1. There is increased coupling due to the sidewall area coupling between the floating gate and control gate polysilicon.
2. There is increased coupling between the channel and the control gate due to the overlap of the control poly over the side select gate region.
3. Lower high voltages can be used for program and erase due to high coupling ratio.
4. Lower high voltages used will provide the inhibit voltage necessary through boosting due to the higher coupling between the control gate overlap with the channel.
5. The control gate poly-silicon covered floating gate has more protection from damage and from external contaminants.
6. Reduced potential difference between the floating gate and control gate allow reduction in thickness of inter-poly dielectric. (improving the coupling further)
7. High coupling reduces the voltage stress across the inter-poly dielectric, resulting in reduce the damage to the dielectric and hence lower charge loss across the dielectric.
8. Five-side coverage of the floating gate eliminates the coupling effects on the floating gate from the neighboring elements making the cell more robust.
9. Lower high voltage requirements enable high-speed designs.
10. Lower high voltage requirements enable smaller peripheral high voltage device and reduce overall chip area.
11. Lower high voltages reduce process complexity and constraints.
12. High coupling in the storage element and the low voltage stress across the inter-poly dielectric enable the use of high quality oxide instead of the ONO dielectric. This may be grown, deposited or a combination of the two.
13. The use of oxide as the dielectric eliminates the known leakage by hoping conduction through Nitride.
14. The use of oxide also eliminated the charge trapping in the Nitride layer with the associated enhanced window closing during write cycling.
15. The elimination of ONO makes the processing simpler.
16. Having uniform oxide cover over the five sides of the floating gate eliminate localized high fields in the protection dielectric. This eliminated the degradation and trapping of charge in the layer improving leakage characteristics and cell endurance.

The use of two side select device in parallel with the floating gate provide additional advantages as follows:

17. The connect diffusions are pushed away from the edges of the floating gate to provide uniform tunneling field and hence uniform tunnel current over the area of the floating gate. This improves endurance.
18. Thermal generation combination at reverse biased junctions can result in generation of hot electrons and holes that can get collected by the floating gate and result in charge loss. This is one reason for the poor retention characteristics at high temperatures. By moving the edge of diffusion away from under the floating gate, the collection of generated carriers from the junction are eliminated resulting in improved retention.
19. Having a high doped region with a different band gap under part of the floating gate during write and erase can result in localized and selective tunneling and high current regions in the tunnel oxide. This can result in enhanced oxide degradation and leakage at those regions with associated endurance and retention degradations.
20. The weak bit issues and tail distributions seen in normal NVM are eliminated by the use of the side-select gates. The on current is always limited by the characteristics of the side select device which is a standard device and the off characteristics is kept close to off condition and hence the peripheral circuitry and complexity of program erase is reduced.
21. The fixed current in the on state and very low current in the off state of the elements help in the efficient design of high-speed sense amplifiers.

It clear that the advantages of the disclosed NAND cell for embedded applications are sufficient to overcome the size disadvantage of the cell elements for high reliability applications like Automotive and high retention applications like smart cards.

What is claimed is:

1. A non-Volatile NAND Memory cell that is programmed and erased by FN Tunneling comprising:
    a. a drain diffusion;
    b. a drain select device adjacent the drain diffusion;
    c. a first memory element;
    d. a first connect diffusion acting as a source of the drain select device and a drain for the first memory element;
    e. a source diffusion;
    f. a source select device adjacent the source diffusion;
    g. a last memory element;
    h. a last connect diffusion acting as a drain of the source select device and a source for the last memory element; and
    i. a number of memory elements in series with the first and the last memory elements, separated from and interconnected to its neighbor by connect diffusions where each memory element between the connect diffusions comprise:
        i. a channel region between the connect diffusions;
        ii. a tunnel oxide region over the channel region;
        iii. two high voltage oxide regions on either side of the tunnel oxide region;
        iv. a floating gate poly-silicon deposed over the tunnel oxide region;
        iv. an inter-poly dielectric layer covering the floating gate poly-silicon; and
        v. a poly-silicon control gate deposed over and on the sides of the floating gate, covering five sides of the floating gate, but separated from it by the inter-poly dielectric layer;
    such that covering of the floating gate on five sides by the control gate provide high coupling between the control gate and floating gate of the same memory element while reducing the impact of coupling to the floating gate from neighboring memory elements.

2. The Non-Volatile NAND Memory cell that is programmed and erased by FN Tunneling, having Memory elements in series separated from and interconnected to its neighbors by the connect diffusions in claim 1, where in, the connect diffusions extend under the two high voltage oxide regions on either side of the tunnel oxide there by forming a channel, between the connect diffusions, under the tunnel oxide, that is controlled by potential on the floating gate.

3. The Non-Volatile NAND Memory cell that is programmed and erased by FN Tunneling, having Memory elements in series separated from and interconnected to its neighbors by the connect diffusions in claim 1, where in, the connect diffusions are spaced away from either side of the tunnel oxide region, there by forming three separate channels in series between the connect diffusions comprising;
    i. a pair of side select gate channels under the high voltage oxide on either side of a floating gate, controlled by the potential on the control gate, applied through the control gate poly-silicon on the sides of the floating gate, and
    ii. a channel under the tunnel oxide that is controlled by a potential on the floating gate.

4. The Non-Volatile NAND Memory cell in claim 1 where in the inter-poly dielectric is oxide.

5. A non-Volatile NAND Memory cell that is programmed and erased by FN Tunneling, having a drain, a source, a drain select device, a source select device, and multiple memory elements, interconnected by connect diffusions, deposed between the drain select device and a source select device in series, each memory element capable of storing bits of data in a floating gate, where each memory element comprise:
    i. a channel region between the connect diffusions in silicon;
    ii. a tunnel oxide region over the channel region;
    iii. a pair of high voltage oxide regions on either side of the tunnel oxide region over laying the connect diffusion;
    iv. a floating gate poly-silicon deposed over the tunnel oxide region forming a floating gate device;
    v. an inter-poly oxide layer covering the floating gate poly-silicon; and
    vi. a poly-silicon control gate poly-silicon deposed over and on the sides of the floating gate, covering five sides of the floating gate, but separated from it by the inter-poly oxide layer;
    such that the control gate poly-silicon covering the sides of the floating gate overlays the pair of high voltage oxide regions on either side of the tunnel oxide, over laying the connect diffusion and couple to the connect diffusion through the high voltage oxide.

6. The non-Volatile NAND Memory cell that is programmed and erased by FN Tunneling having multiple memory elements in claim 5, where in, having the poly-silicon control gate deposed over and on sides of the floating gate but separated from it by the inter-poly oxide increase coupling between the control gate poly-silicon and the floating gate poly-silicon across the inter-poly oxide.

7. The non-Volatile NAND Memory cell with Memory elements having the poly-silicon control gate deposed over and on sides of the floating gate but separated from it by the inter-poly oxide, in claim 6, where in, increased coupling between the control gate poly-silicon and floating gate poly-silicon allow reduction of high voltages used for program and erase.

8. The non-Volatile NAND Memory cell having multiple memory elements in claim 5, where in, having the poly-silicon control gate deposed over and on sides of the floating gate but separated from it by the inter-poly oxide protects the floating gate from external contaminants.

9. The non-Volatile NAND Memory cell having multiple memory elements in claim 5, where in, the poly-silicon control gate deposed over and on sides of the floating gate but separated from it by the inter-poly oxide prevent coupled potentials from adjacent cells and elements impacting the potential of the floating gate.

10. The non-Volatile NAND Memory cell having multiple memory elements in claim 5, where in, the control gate poly-silicon over lays the connect diffusion, but is separated from it by the high voltage oxide adjacent the tunnel oxide, increases the coupling between the control gate poly-silicon and the connect diffusion there by enabling the generation of necessary inhibit voltage for the write of selected data from the lower programming voltages used.

11. A non-Volatile NAND Memory cell that is programmed and erased by FN Tunneling having a drain, a source, a drain select device, a source select device, and multiple memory elements, interconnected by connect diffusions, deposed in series between the drain select device and a source select device, each memory element capable of storing bits of data in a floating gate, where each memory element comprise:
  i. a channel region between the connect diffusions in silicon;
  ii. a tunnel oxide region over the channel region;
  iii. a pair of high voltage oxide regions on either side of the tunnel oxide region over the channel region;
  iv. a floating gate poly-silicon deposed over the tunnel oxide region forming a floating gate device;
  v. an inter-poly oxide layer covering the floating gate poly-silicon;
  vi. a poly-silicon control gate deposed over and on the sides of the floating gate, covering five sides of the floating gate, but separated from it by the inter-poly oxide layer; and
  vii. a pair of side select devices formed by the control gate poly-silicon, that cover the sides of the floating gate poly-silicon, over laying the high voltage oxide;
  such that the side select devices move the connect diffusions away from the edges of the floating gate over laying the tunnel oxide.

12. The non-Volatile NAND Memory cell that is programmed and erased by FN Tunneling in claim 11, where in, having the poly-silicon control gate deposed over and on sides of the floating gate but separated from it by the inter-poly oxide allow increased coupling between the control gate poly-silicon and the floating gate poly-silicon across the inter-poly oxide.

13. The non-Volatile NAND Memory cell that is programmed and erased by FN Tunneling in claim 11, where in, the increased coupling between the control gate poly-silicon and floating gate poly-silicon allow reduction of high voltages used for program and erase.

14. The non-Volatile NAND Memory cell in claim 11, where in, having the poly-silicon control gate deposed over and on sides of the floating gate but separated from it by the inter-poly oxide protects the floating gate from external contaminants.

15. The non-Volatile NAND Memory cell in claim 11, where in, having the poly-silicon control gate deposed over and on sides of the floating gate but separated from it by the inter-poly oxide eliminate impact of coupled potentials from adjacent cells and elements impacting the floating gate.

16. The non-Volatile NAND Memory cell in claim 11, where in, the side select gates move the connect diffusion away from the edge of the tunnel oxide and the floating gate improving high-temperature operation of the memory element.

17. The non-Volatile NAND Memory cell in claim 11, where in, the side select gates move the connect diffusion away from the edge of the tunnel oxide and the floating gate improving the retention and endurance of the memory element.

18. The non-Volatile NAND Memory cell having multiple memory elements in claim 11, where in, the control gate poly-silicon forming the side select devices over lay the channel, but separated from it by the high voltage oxide adjacent the tunnel oxide, there by increase the coupling between the control gate poly-silicon and the channel to enable the lower program voltages used, to generate necessary inhibit voltage for the write of selected data.

19. The non-Volatile NAND Memory cell in claim 11, where in, the side select gates move the connect diffusion away from the edge of the tunnel oxide and the floating gate move the junctions where hot carriers can be generated away from the floating gate improving retention.

20. The non-Volatile NAND Memory cell in claim 11, where in, the side select gates move the connect diffusion away from the edge of the tunnel oxide and the floating gate move the junctions away from under the edge of the floating gate making the programs erase voltage stress across the tunnel oxide uniform resulting in improved endurance characteristics for the memory element.

* * * * *